(12) United States Patent
Ba et al.

(10) Patent No.: US 8,755,247 B2
(45) Date of Patent: Jun. 17, 2014

(54) SYSTEM AND METHOD FOR PROCESSING SIGNALS IN HIGH SPEED DRAM

(71) Applicant: Micron Technology, Inc., Boise, ID (US)

(72) Inventors: Ben Ba, Boise, ID (US); Victor Wong, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/886,096

(22) Filed: May 2, 2013

(65) Prior Publication Data

US 2013/0242685 A1    Sep. 19, 2013

Related U.S. Application Data

(62) Division of application No. 13/098,168, filed on Apr. 29, 2011, now Pat. No. 8,441,886, which is a division of application No. 11/862,933, filed on Sep. 27, 2007, now Pat. No. 7,936,639.

(51) Int. Cl.
    *G11C 11/00* (2006.01)

(52) U.S. Cl.
    USPC ............... 365/230.06; 365/233.1; 365/233.14

(58) Field of Classification Search
    USPC ....................... 365/230.06, 233.13
    See application file for complete search history.

(56) References Cited

U.S. PATENT DOCUMENTS

| | | | |
|---|---|---|---|
| 4,165,540 A * | 8/1979 | Vinot | 365/154 |
| 4,843,255 A * | 6/1989 | Stuebing | 327/230 |
| 5,959,930 A | 9/1999 | Sakurai | |
| 6,411,553 B1 | 6/2002 | Wright | |
| 6,552,596 B2 | 4/2003 | Cowles | |
| 6,765,842 B2 | 7/2004 | Kim | |
| 6,944,082 B2 | 9/2005 | Mizugaki et al. | |
| 7,082,064 B2 | 7/2006 | Nagrani | |

(Continued)

FOREIGN PATENT DOCUMENTS

| | | |
|---|---|---|
| JP | 2001068650 | 3/2001 |
| JP | 2001236783 | 8/2001 |
| JP | 2002133861 | 5/2002 |
| JP | 2002298575 | 10/2002 |

OTHER PUBLICATIONS http://downloand.micron.com/pdf/technotes/ddr3/TN41_01DDR3%20Power.pdf, "Calculating Memory System Power for DDR3".

(Continued)

*Primary Examiner* — Harry W Byrne
*Assistant Examiner* — Lance Reidlinger
(74) *Attorney, Agent, or Firm* — Fletcher Yoder, P.C.

(57) ABSTRACT

The embodiments described herein provide memory devices. In one embodiment, a memory device includes bank control logic configured to generate a modified bank address signal and an active driver configured to provide a bank activate signal, receive an activate command signal, execute an activate command of the activate command signal at each one of a group of clock cycles, in which each one of the group of clock cycles is greater than one clock cycle, and receive the modified bank address signal, in which the modified bank address signal is high for at least a portion of each one of the group of clock cycles and the at least a portion of each one of the group of clock cycles is greater than one clock cycle.

20 Claims, 5 Drawing Sheets

(56) References Cited

U.S. PATENT DOCUMENTS

| | | |
|---|---|---|
| 7,151,700 B2 | 12/2006 | Ba |
| 7,164,600 B2 | 1/2007 | Ba |
| 7,164,615 B2 | 1/2007 | Park et al. |
| 7,236,385 B2 | 6/2007 | Thompson |
| 7,447,102 B2 | 11/2008 | Chang et al. |
| 7,483,331 B2 | 1/2009 | Uchida |
| 2002/0016032 A1 | 2/2002 | Mizugaki |
| 2002/0048208 A1 | 4/2002 | Mizugaki |
| 2002/0159314 A1 | 10/2002 | Mizugaki |
| 2005/0168266 A1 | 8/2005 | Shin |
| 2006/0245231 A1 | 11/2006 | Thompson |
| 2007/0008788 A1 | 1/2007 | Ba |

OTHER PUBLICATIONS http://download.micron.com/pdf/presentations/ddr3_sdram/ddr3_advantages.pdf, "DDR3 Advantages".

* cited by examiner

SYSTEM AND METHOD FOR PROCESSING SIGNALS IN HIGH SPEED DRAM

CROSS-REFERENCE TO RELATED APPLICATION

This application is a divisional of U.S. patent application Ser. No. 13/098,168, which was filed on Apr. 29, 2011, now U.S. Pat. No. 8,441,886, which issued on May 14, 2013, which was a divisional of U.S. patent application Ser. No. 11/862,933, which was filed on Sep. 27, 2007, now U.S. Pat. No. 7,936,639, which issued on May 3, 2011.

BACKGROUND

1. Field of the Invention

Embodiments of the present invention relate generally to memory devices and more specifically to the processing of signals in high speed memory arrays.

2. Description of the Related Art

Electronic systems and devices, such as computers, personal organizers, cell phones, portable audio players, etc., typically include one or more memory devices to provide storage capability for the system. System memory is generally provided in the form of one or more integrated circuit chips and generally includes both random access memory (RAM) and read-only memory (ROM). System RAM is typically large and volatile and provides the system's main memory. Synchronous Dynamic RAM (SDRAM) is a commonly employed type of random access memory.

As will be appreciated, there are a number of different types of SDRAM devices. Early generation SDRAM devices are generally configured such that data from the memory cells may be accessed and one bit of data may be output on every clock cycle. Demands for higher processing speeds led to the development of Double Data Rate (DDR) SDRAM devices. DDR SDRAM devices generally allow for two bits of data to be accessed and output on every clock cycle. To achieve this, DDR SDRAM devices commonly clock data out on every rising and every falling edge of the clock signal. For example, with a clock frequency of 100 MHz, an SDRAM will transfer data on every rising edge of the clock pulse, thus achieving an effective 100 MHz transfer rate, or 10 ns to complete one clock cycle (also referred to as $t_{ck}$). DDR SDRAM will transfer data on every rising and falling edge of the clock, achieving an effective rate of 200 MHz with the same clock frequency.

Faster types of SDRAM include DDR2 SDRAM and DDR3 SDRAM. The advantage of DDR2 and DDR3 SDRAM over previous generations is the ability to run at even higher clock speeds due to an improved electrical interface, thus reducing the time required for a clock cycle. For example, DDR SDRAM generally allows for data to be transferred from the memory device at an effective clock rate of 200 to 550 MHz, or about 5 ns for one clock cycle ($t_{ck}$=5 ns). DDR2 SDRAM allows for data transfer around 400-1066 MHz, or about 3 ns for one clock cycle ($t_{ck}$=3 ns), while DDR3 SDRAM allows for effective data transfer of 800-1600 MHz, or about 1.5 ns for one clock cycle ($t_{ck}$=1.5 ns). Faster versions of DDR3 SDRAM or further generations of SDRAM may be under 1 ns for one clock cycle. DDR2 and DDR3 SDRAM clock frequency is further boosted by other enhancements, such as larger pre-fetch buffers. With the increasing speeds, internal transfer of data within the memory device becomes increasingly difficult to manage.

During operation of these types of SDRAM, an activate (or active) command may be sent to the memory array. An activate command activates a row of the memory array. In some cases, one may have to wait multiple clock cycles before another activate command can be executed, thus the timing of the activate command signal may be important. Further, an internal bank address signal (also referred to as bank info signal or bank signal) should also be aligned with the activate signal, so that both signals are "high" at the same time. Typically, such alignment problems are resolved through the introduction of a clock signal to latch the various command signals. However, the addition of a latch clock signal adds to the logic and layout of the circuits that process the signals, and also requires tuning of the clock signal with the various command signals.

Embodiments of the present invention may be directed to one or more of the problems set forth above.

DETAILED DESCRIPTION OF SPECIFIC EMBODIMENTS

Figure 1:
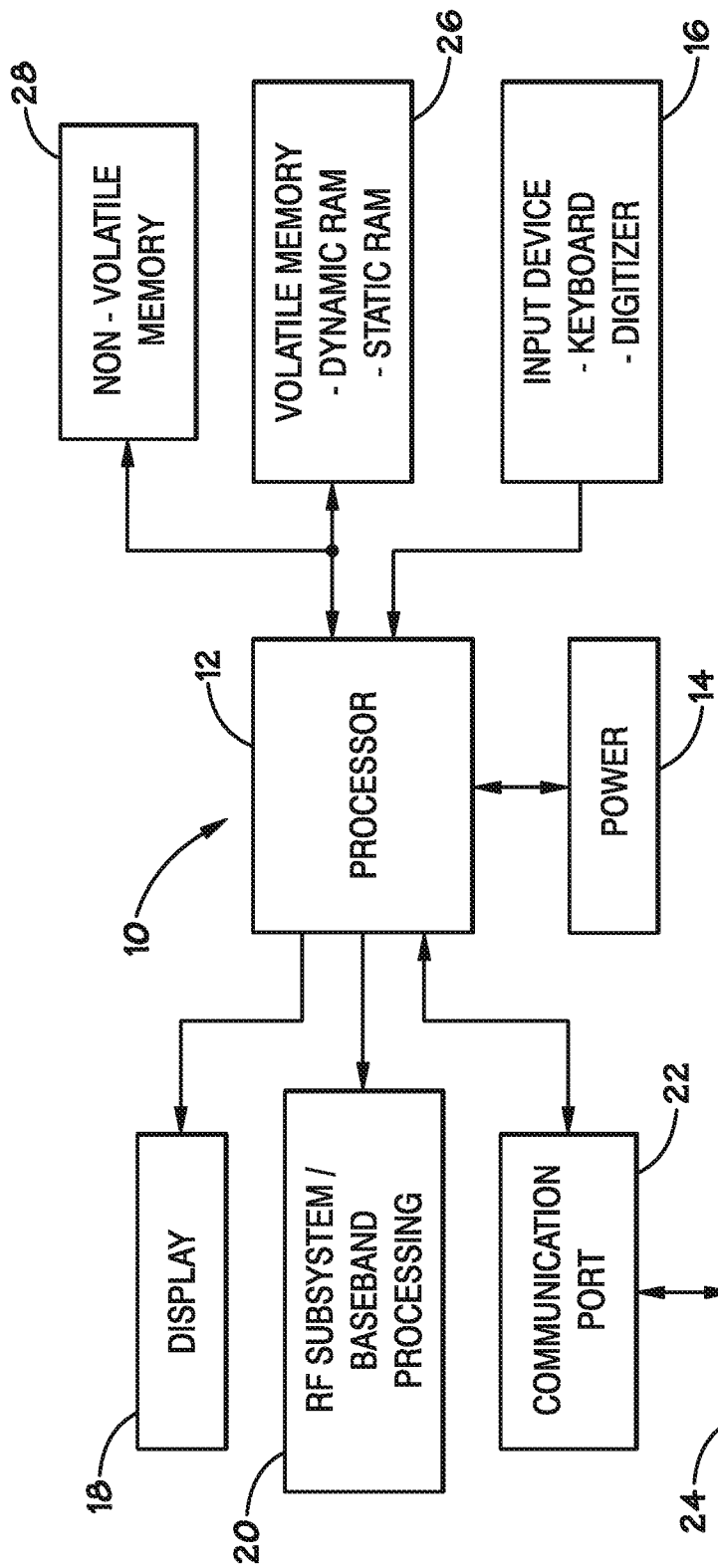
FIG. 1 illustrates a block diagram of an embodiment of a processor-based device having a memory device in accordance with embodiments of the present invention.

Turning now to the drawings, and referring initially to FIG. 1, a block diagram depicting an embodiment of a processor-based system, generally designated by reference numeral 10, is illustrated. The system 10 may be any of a variety of types such as a computer, pager, cellular phone, personal organizer, portable audio player, control circuit, camera, etc. In a typical processor-based device, a processor 12, such as a microprocessor, controls the processing of system functions and requests in the system 10. Further, the processor 12 may comprise a plurality of processors that share system control.

The system 10 typically includes a power supply 14. For instance, if the system 10 is a portable system, the power supply 14 may include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a stylus, a mouse, and/or a voice recognition system, for instance. A display 18 may also be coupled to the processor 12. The display 18 may include an LCD, a CRT, LEDs, and/or an audio display, for example.

Furthermore, an RF sub-system/baseband processor 20 may also be couple to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs, memory is used to enable the processor 12 to be efficient. Generally, the memory is coupled to the processor 12 to store and facilitate execution of various programs. For instance, the processor 12 may be coupled to volatile memory 26, which may include volatile memory, such as Dynamic Random Access Memory (DRAM), Double Data Rate (DDR) DRAM, and/or Static Random Access Memory (SRAM). The processor 12 may also be coupled to non-volatile memory 28. The non-volatile memory 28 may include a read only memory (ROM), such as an EPROM or Flash Memory, to be used in conjunction with the volatile memory. Additionally, the non-volatile memory 28 may include a high capacity memory such as a disk drive, tape drive memory, CD ROM drive, DVD, read/write CD ROM drive, and/or a floppy disk drive.

The volatile memory 26 may include a number of SDRAMs which may implement DDR, DDR2, DDR3, or other technology. The SDRAM differs from a DRAM in that the SDRAM is controlled synchronously with a timing source, such as the system clock. To accomplish synchronous control, latches are used to provide data and other information on the inputs and outputs of the SDRAM. Thus, in a read operation for example, the processor 12 may access a data output latch after a specific number of clock cycles after issuing the read request. The number of clock cycles typically corresponds to the amount of time needed to access the requested data, move the data to the output latch, and allow the data to stabilize. The data is clocked out of the output latch synchronous with the system clock which provides the timing source for the processor 12. Synchronization of the data read from the output latch with the system clock is generally implemented via a delay locked loop (DLL) circuit. In general, the DLL locks the data output signal to the system clock by shifting the output data in time such that it is nominally aligned with the system clock. Thus, the DLL can compensate for timing delays introduced by various components in the SDRAM.

Write operations also are performed synchronously (e.g., in synchronization) with a timing source, such as the system clock or other externally provided timing source. Thus, data may be clocked into an input latch and written to the memory array under control of a write clock provided from the external device which is performing the write operation. Delay locked loops may also be implemented to synchronize write data with the write clock.

Figure 2:
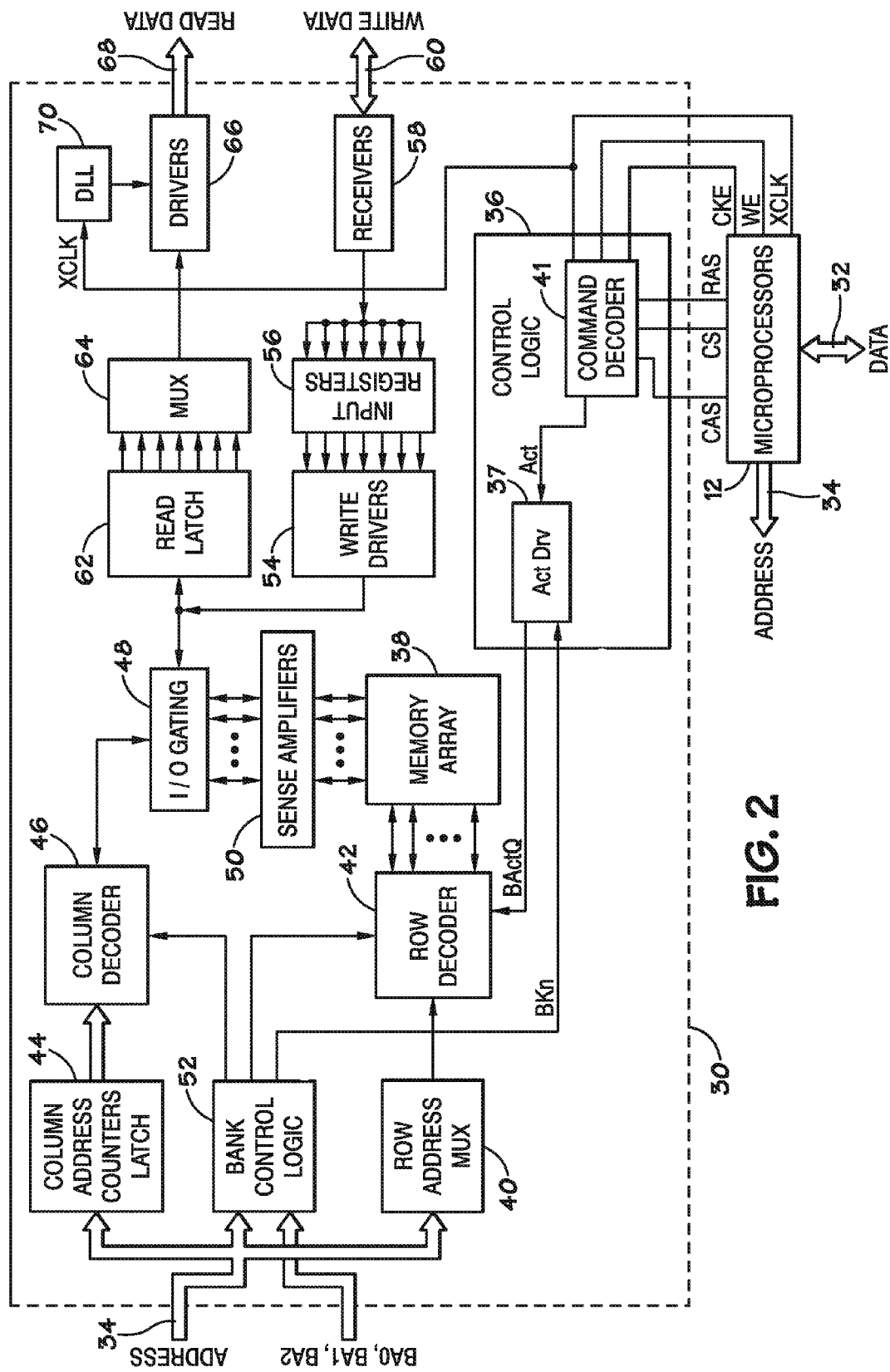
FIG. 2 illustrates a block diagram of an embodiment of a memory device in accordance with embodiments of the present invention.

Turning now to FIG. 2, a block diagram depicting an exemplary embodiment of an SDRAM 30 is illustrated, such as DDR3 SDRAM, for example. The present technique may not be limited to DDR3 SDRAM, and may be applicable to other synchronous memory devices, and particularly to other high speed memory devices and other devices for use in communication applications. Those skilled in the art will recognize that various devices may be used in the implementation of the present invention. As will be appreciated, the description of the SDRAM 30 has been simplified for illustrative purposes and is not intended to be a complete description of all features of an SDRAM.

Control, address, and data information provided over a memory bus are represented by individual inputs to the SDRAM 30. These individual representations are illustrated by a data bus 32, address lines 34, and various discrete lines directed to control logic 36. As will be appreciated, the various buses and control lines may vary depending on the system. As is known in the art, the SDRAM 30 includes a memory array 38 which comprises memory banks having rows and columns of addressable memory cells. Each memory cell in a row is coupled to a word line. Additionally, each memory cell in a column is coupled to a bit line. Each cell in the memory array 38 typically includes a storage capacitor and an access transistor as is conventional in the art.

The SDRAM 30 interfaces with, for example, a microprocessor 12 through address lines 34 and data lines 32. Alternatively, the SDRAM 30 may interface with other devices, such as an SDRAM controller, a microcontroller, a chip set, or other electronic system. The microprocessor 12 also may provide a number of control signals to the SDRAM 30. Such signals may include row and column address strobe signals RAS and CAS, chip select signal CS, a write enable signal WE, a clock enable signal CKE, an external clock signal XCLK, and other conventional control signals. The control logic 36 controls the many available functions of the SDRAM 30. The control logic 36 also includes an active driver 37 (ActDrv) and a command decoder 41. In addition, various other control circuits and signals not detailed herein contribute to the operation of the SDRAM 30, as known to one of ordinary skill in the art.

A row address multiplexer 40 and a row decoder 42 receive and decode row addresses from row address signals provided on the address lines 34. Each unique row address corresponds to a row of cells in the memory array 38. The row decoder 42 typically includes a word line driver, an address decoder tree, and circuitry which translates a given row address received from row address buffers 40 and selectively activates the appropriate word line of the memory array 38 via the word line drivers.

A column address counter/latch 44 and a column decoder 46 receive and decode column address signals provided on the address lines 34. The column decoder 46 may also determine when a column is defective, as well as the address of a replacement column. The column decoder 46 is coupled to I/O gating 48, which is in turn coupled to sense amplifiers 50. The sense amplifiers 50 are coupled to complementary pairs of bit lines of the memory array 38. Additionally, bank control logic 52 receives and decodes bank address signals BA0, BA1, BA2, etc., provided on the address lines 34. The bank control logic 52 outputs a bank signal to the column decoder 46 and the row decoder 42, indicating banks of the memory array 38. Additionally, the bank control logic 52 outputs internal bank address signal Bkn to the active driver 37 of the control logic 36.

The I/O gating 48 is coupled to data-in (i.e., write) and data-out (i.e., read) circuitry. The data in circuitry may comprise write drivers 54, input registers 56, and receivers 58 configured to receive write data. The write drivers 54, input registers 56, and receivers 58 are configured to receive external write data serially, and convert the serial write data to parallel data for storage in the memory array 38. During a write operation, the write data bus 60 provides data to the receivers 58. As will be appreciated, the write data bus 60 is part of the databus 32. The I/O gating 48 receives data from the write driver 54 and stores the data in the memory array 38 as a charge on a capacitor of a cell at an address specified on the address line 34.

The control logic 36 includes the active driver 37 and the command decoder 41. The command decoder 41 receives various input signals CLK, CKE, CS, CAS, RAS, and WE, such as from the microprocessor 12 or other device, and provides a global activate signal (ACT) to the active driver circuit. The active driver 37 receives a bank address signal (BKn) from the bank control logic 52. As will be discussed further below, the active driver 37 outputs a bank activate signal (BActQ) to the row decoder 42.

During a read operation, the SDRAM 30 transfers data to the microprocessor 12 from the memory array 38. Complementary bit lines for the accessed cell are equilibrated to a reference voltage provided by an equilibration circuit and a reference voltage supply. The charge stored in the accessed cell is then shared with the associated bit lines. The sense amplifier 48 detects and amplifies a difference in voltage between the complementary bit lines. Address information received on address lines 34 selects a subset of the bit lines and couples them to complementary pairs of input/output (I/O) wires or lines. The I/O wires pass the amplified voltage signals to the data-out circuitry, such as read latch 62, multiplexer 64, and drivers 66. The read latch 62 is configured to receive data from the I/O gating 48 and to transmit the data in parallel to a multiplexer 64 which serializes the data to read data bus 68. As with the write data bus 60, the read data bus 68 is a high speed data bus configured to operate at 400 MHz or higher. The timing source for the read drivers 66 may be provided by a delay locked loop (DLL) circuit 70 which provides a shifted clock signal (DLLCK) which is synchronous with the external system clock signal (XCLK), thus locking the output data signal on the read data bus 68 to the system clock XCLK.

Figure 3:
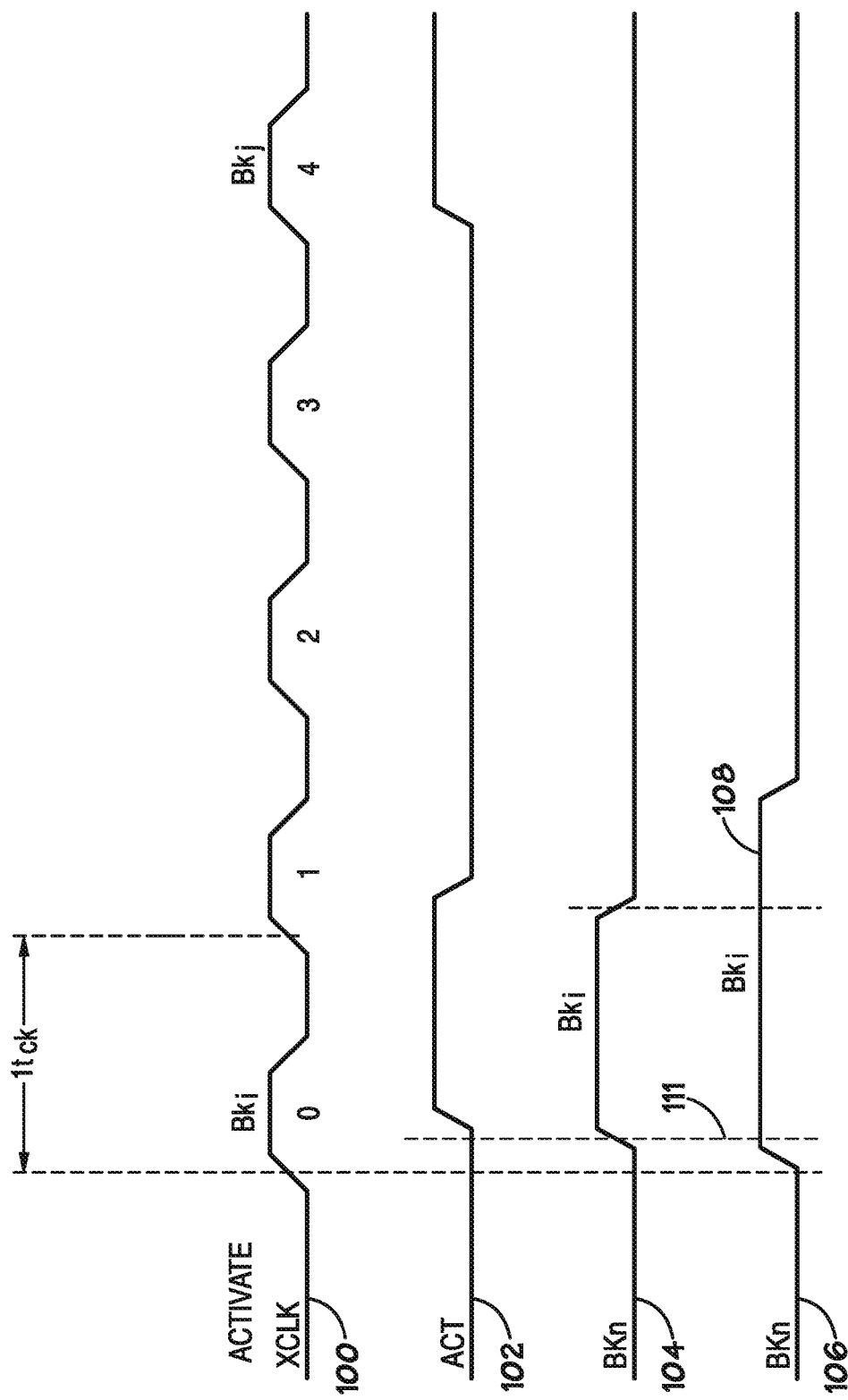
FIG. 3 is a diagram of a clock signal, an activate signal, a typical bank address signal, and a modified bank address signal of a memory device in accordance with one or more embodiments of the present invention.

As discussed above, operation of the SDRAM 30 may include sending activate signals and internal bank address signals (Bkn). FIG. 3 depicts a system clock signal 100 illustrating activate commands, and an activate command signal 102 (ACT). Further, FIG. 3 also depicts a conventional bank address signal 104 (BKn), and a modified bank address signal 106 (BKn) in accordance with an embodiment of the present invention. Each peak in the clock signal 100 is one-half of a clock cycle ($t_{ck}$), and the signals are shown for five clock cycles, 0, 1, 2, 3, and 4. As discussed above, the clock signal may be provided by the system clock (XCLK) or any other suitable clock signal, and a rise and fall of the clock signal is referred as one clock cycle ($t_{ck}$).

The activate commands may also be latched onto the external system clock signal (XCLK), as depicted by clock signal 100. However, the short duration of a clock cycle in some embodiments, such as DDRIII (less than 1 ns), means that an activate command must wait four clock cycles before activating the next bank. For example, as shown in FIG. 3, in clock signal 100 the activate signal sends an activate command to bank i ($Bk_i$), but waits until the fifth clock cycle to send an activate command to bank j ($Bk_j$). This time between successive activate commands to different banks may be referred to as "time for RAS-to-RAS delay" ($t_{rrd}$).

The ACT signal 102 and a typical bank address signal 104, such as used in DDRIII SDRAM, typically begin after a short delay from the start of a clock cycle ($t_{ck}$) of an XCLK latch. The typical bank address signal 104 is asserted for less than or equal to one clock cycle. As illustrated in FIG. 3, both the bank address signal 104 and the ACT signal 102 should remain high at the same time to ensure that the correct bank is activated.

Bank address signal 106 is a modified bank address signal in accordance with an embodiment of the present invention. The trailing edge 108 of the bank address signal 106 has been expanded, utilizing the additional clock cycles of the activate signal 102. Additionally, expanding the trailing edge 108 of the bank address signal 106 allows the front edge 110 of the bank address signal 106 to be sped up. For example, as illustrated by line 111, the modified bank address signal 106 is "high" earlier in the clock cycle, as opposed to the typical bank address signal 104, which does peak until after line 111. Therefore, as can be seen in the figure, the modified bank address signal 106 is greater than one clock cycle ($t_{ck}$). The modified bank address signal 106 may provide for improvements in the active driver. The active driver no longer needs to be latched to a clock for alignment, saving current and reducing the logic and layout area needed for the active driver. Additionally, the active driver has improved reliability, performance, and a faster RAS-to-CAS delay ($t_{RCD}$).

The trailing edge 108 of the bank address signal 106 may be expanded by latching to the active command signal 102, passing the bank address signal 106 and a delayed version through an OR gate, using a self latch operation, or any suitable technique or combination thereof. In the embodiment described below, the active command signal 102 latches the bank address signal to expand the trailing edge of the bank address signal.

Figure 4:
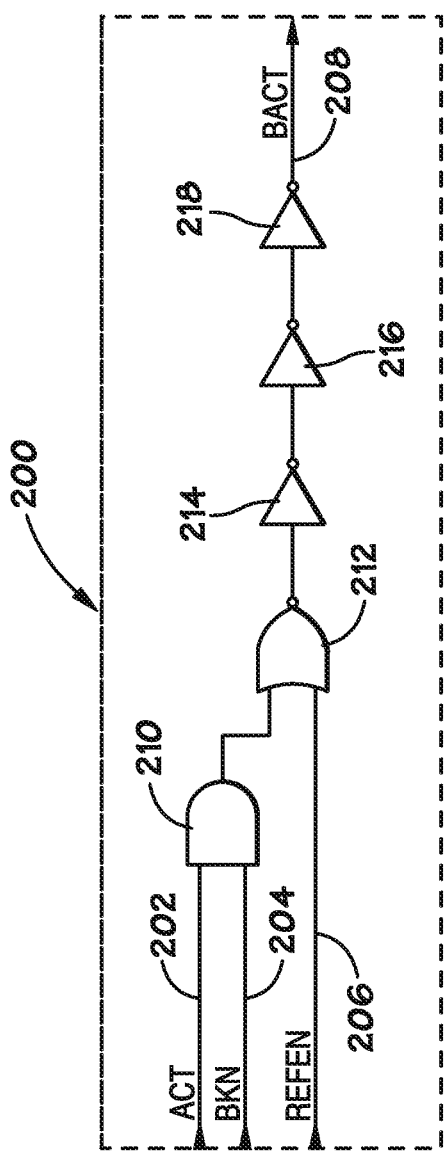
FIG. 4 is a circuit diagram of an active driver of a memory device constructed in accordance with an embodiment of the present invention.

Referring now to FIG. 4, an active driver 200 is depicted in accordance with an embodiment of the present invention. The active driver 200 receives inputs activate command signal 202 (ACT), modified bank address signal 204 (BKn), such as signal 106 from FIG. 3 received from a bank control logic, and refresh signal 206 (RefEn). The active driver 200 outputs bank activate signal 208. As discussed above, the modified bank address signal 204 may be expanded in different ways, included latching the bank address signal 204 to the activate command signal 202, combining the bank address signal 204 and a delayed version in an OR gate, using a self latch scheme, or any other suitable technique or any combination thereof.

The activate command signal 202 and Bank address signal 204 are first provided to an AND gate 210, whose output is directed to a NOR gate 212. The refresh enable signal 206 is also provided to the NOR gate 212, and the output of the NOR gate 212 is provided to inverters 214, 216, and 218. The inverter 214 replaces the use of a latch clock signal. Thus, because no latch clock signal or corresponding logic is needed, the design of the active driver may include the improvements described above, such as reduced logic and layout area, faster performance and increased reliability, and easier design. Further, the elimination of a latch clock signal saves current and requires less tuning.

The activate driver 200 may be coupled to a command decoder, such as the row decoder 42 depicted in FIG. 2. The output from active driver 200, the bank activate signal 208 (BActQ) is sent to a row decoder and then to a memory array of the memory device.

Figure 5:
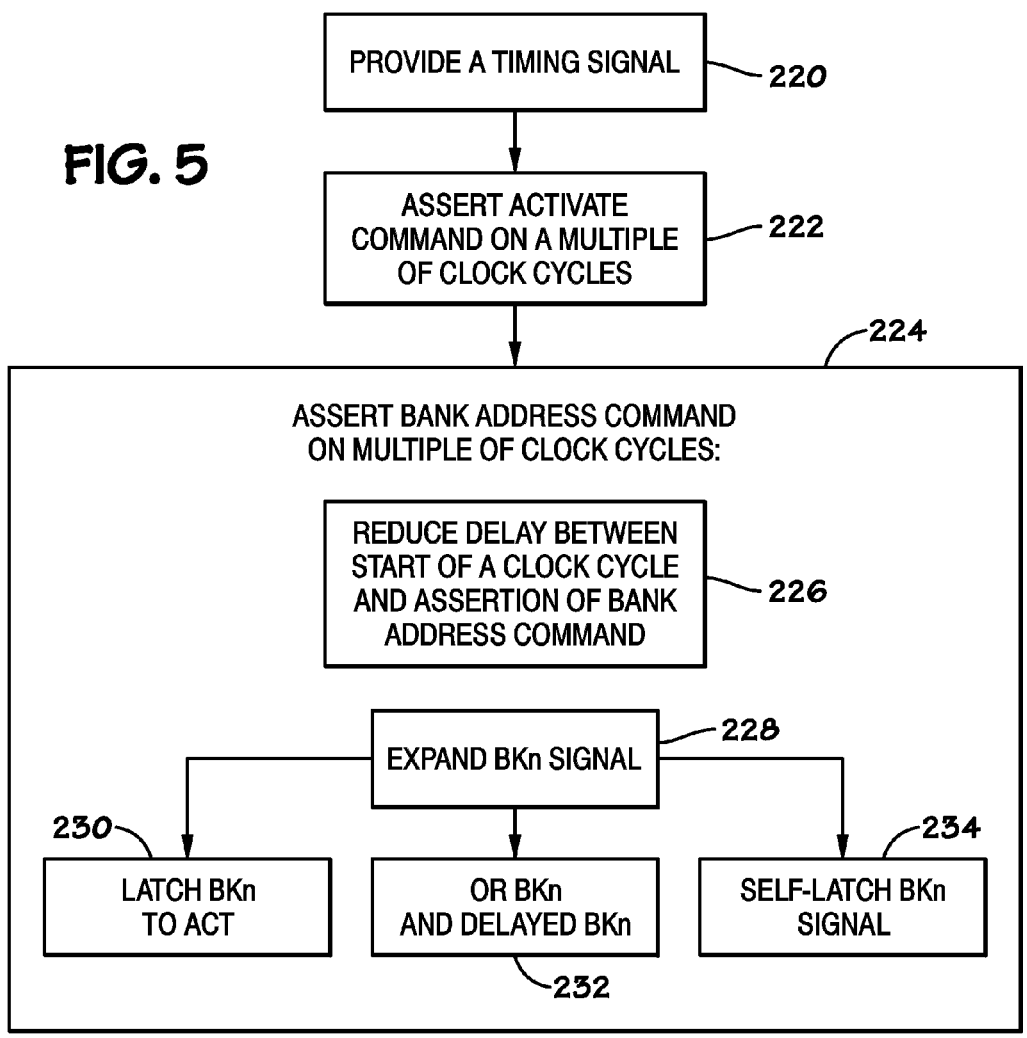
FIG. 5 is flowchart depicting operation of a memory device having a modified bank address signal in accordance with an embodiment of the present invention.

FIG. 5 depicts operation of the SDRAM 30 having a modified bank address signal (BKn) in accordance with an embodiment of the present invention. Initially, a timing signal (e.g., XCLK signal 100 depicted in FIG. 3) may be provided (block 220), such as from a system clock. The timing signal may include a plurality of clock cycles (tck). An activate signal (e.g., ACT signal 102 depicts in FIG. 3) may assert an activate command every multiple number of clock cycles (block 222), as also shown above in FIG. 3.

The bank address signal (BKn signal 106 depicted in FIG. 3) may assert a bank address command on the every multiple number of clock cycles of the activate signal (block 224). However, as discussed above, for the modified bank address signal the delay between the assertion of the bank address command and the activate command at the start of a clock cycle may be reduced (block 226).

Additionally, as also discussed above, the trailing edge of the bank address signal may be expanded (block 228) such that the bank address command may be asserted for additional clock cycles. In one embodiment, the bank address signal may be expanded by latching the bank address signal to the activate signal (block 230). In other embodiments, the bank address signal may be expanded by providing the bank address signal and a delayed bank address through an OR gate (block 232). Further, in yet other embodiments, the bank address signal may be expanded by a self-latch (block 234).

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory device, comprising:
   bank control logic configured to generate a modified bank address signal by passing a bank address and a delayed bank address signal through an OR gate, wherein the delayed bank address signal is a time delayed version of the bank address signal; and
   an active driver configured to:
      provide a bank activate signal;
      receive an activate command signal and execute an activate command of the activate command signal at each one of a group of clock cycles, wherein each one of the group of clock cycles is greater than one clock cycle; and
      receive the modified bank address signal, wherein the modified bank address signal is high for at least a portion of each one of the group of clock cycles, and wherein the at least a portion of each one of the group of clock cycles is greater than one clock cycle.

2. The memory of claim 1, wherein the modified bank address signal transitions to a high state at a first time and transitions to a low state at a second time, and the activate command transitions to a high state at a third time and transitions to a low state at a fourth time;
   wherein the third time is after the first time, and wherein the second time is after the fourth time.

3. The memory of claim 2, wherein a difference between the second time and the first time is greater than one clock cycle.

4. The memory device of claim 1, comprising a command decoder configured to transmit the activate command signal to the active driver.

5. The memory device of claim 4, wherein the command decoder is configured to transmit the activate command after each one of a group of clock cycles.

6. The memory device of claim 5, comprising control logic, wherein the control logic comprises the command decoder and the active driver.

7. The memory device of claim 1, wherein the bank control logic is further configured to transmit the modified bank address signal to the active driver.

8. The memory device of claim 1, wherein the memory device is a DDR3 SDRAM memory device.

9. The memory device of claim 1, wherein the memory device is a DDR2 SDRAM memory device.

10. The memory device of claim 1, wherein each one of the group of clock cycles comprises four clock cycles.

11. A memory device, comprising:
    bank control logic configured to generate a modified bank address signal by latching a bank address to itself;
    an active driver configured to:
       provide a bank activate signal;
       receive an activate command signal and execute an activate command of the activate command signal at each one of a group of clock cycles, wherein each one of the group of clock cycles is greater than one clock cycle; and
       receive the modified bank address signal, wherein the modified bank address signal is high for at least a portion of each one of the group of clock cycles, and wherein the at least a portion of each one of the group of clock cycles is greater than one clock cycle.

12. The memory of claim 11, wherein the modified bank address signal transitions to a high state at a first time and transitions to a low state at a second time, and the activate command transitions to a high state at a third time and transitions to a low state at a fourth time;
    wherein the third time is after the first time, and wherein the second time is after the fourth time.

13. The memory of claim 12, wherein a difference between the second time and the first time is greater than one clock cycle.

14. The memory device of claim 11, wherein the active driver comprises an inverter.

15. The memory device of claim 11, comprising a row decoder configured to receive the bank activate signal from the active driver.

16. The memory device of claim 11, wherein the active driver is configured to receive a refresh signal.

17. The memory device of claim 11, wherein the activate command executes on every first duration of each one of the group of clock cycles.

18. The memory device of claim 11, wherein the modified bank address signal is high for at least one or more clock cycles and for a time between successive activate commands.

19. A memory device, comprising:
    an active driver comprising a NOR gate and an AND gate, wherein the active driver is configured to:
       provide a bank activate signal;
       receive an activate command signal, wherein an activate command of the activate command signal is configured to execute at each one of a group of clock cycles, wherein each one of the group of clock cycles is greater than one clock cycle; and
       receive a bank address signal, wherein the bank address signal is high for at least a portion of each one of the group of clock cycles, and wherein the at least a portion of each one of the group of clock cycles is greater than one clock cycle;
    wherein the AND gate is configured to receive the activate command signal and the bank signal, and the NOR gate is configured to receive an output of the AND gate and a refresh signal.

20. The memory device of claim 19, wherein the active driver comprises an inverter configured to receive an output of the NOR gate.

* * * * *